United States Patent
Steigerwald et al.

(10) Patent No.: US 6,646,292 B2
(45) Date of Patent: Nov. 11, 2003

(54) SEMICONDUCTOR LIGHT EMITTING DEVICE AND METHOD

(75) Inventors: Daniel A. Steigerwald, Cupertino, CA (US); Michael R. Krames, Mountain View, CA (US)

(73) Assignee: Lumileds Lighting, U.S., LLC, San Jose, CA (US)

(*) Notice: Subject to any disclaimer, the term of this patent is extended or adjusted under 35 U.S.C. 154(b) by 0 days.

(21) Appl. No.: 09/803,002

(22) Filed: Mar. 9, 2001

(65) Prior Publication Data

US 2002/0125485 A1 Sep. 12, 2002

Related U.S. Application Data

(63) Continuation-in-part of application No. 09/469,657, filed on Dec. 22, 1999, now Pat. No. 6,486,499, and a continuation-in-part of application No. 09/470,540, filed on Dec. 22, 1999, now Pat. No. 6,473,885.

(51) Int. Cl.[7] ............................................. H01L 33/00
(52) U.S. Cl. ....................................... 257/103; 257/104
(58) Field of Search ................................. 257/103, 104

(56) References Cited

U.S. PATENT DOCUMENTS

| | | |
|---|---|---|
| 4,153,905 A | 5/1979 | Charmakadze et al. ...... 357/16 |
| 5,563,422 A | 10/1996 | Nakamura et al. ............ 257/13 |
| 6,091,085 A | 7/2000 | Lester ........................ 257/98 |
| 6,365,923 B1 * | 4/2002 | Kamei |

FOREIGN PATENT DOCUMENTS

| | | |
|---|---|---|
| DE | 19921987 A1 | 5/1999 |
| EP | 0926744 A2 | 6/1999 |
| WO | WO96/09653 | 3/1996 |

OTHER PUBLICATIONS

J.J. Steppan et al., "A Review Of Corrosion Failure Mechanisms During Accelerated Tests", vol. 134, No. 1, Jan. 1987.

Mensz et al., Electronic Letters 33 (24) pp. 2066–2068, 1997.

K.D. Hobart et al., J. Electrochem. Soc. 146, 3833–3836, 1999.

* cited by examiner

Primary Examiner—Stephen D. Meier
(74) Attorney, Agent, or Firm—Patent Law Group LLP

(57) ABSTRACT

A light-emitting device includes: a semiconductor structure formed on one side of a substrate, the semiconductor structure having a plurality of semiconductor layers and an active region within the layers; and first and second conductive electrodes contacting respectively different semiconductor layers of the structure; the substrate comprising a material having a refractive index $n>2.0$ and light absorption coefficient $\alpha$, at the emission wavelength of the active region, of $\alpha>3$ cm$^{-1}$. In a preferred embodiment, the substrate material has a refractive index $n>2.3$, and the light absorption coefficient, $\alpha$, of the substrate material is $\alpha<1$ cm$^{-1}$.

30 Claims, 2 Drawing Sheets

SEMICONDUCTOR LIGHT EMITTING DEVICE AND METHOD

This is a continuation-in-part of U.S. patent application Ser. No. 09/469,657, now U.S. Pat. No. 6,486,499 and of U.S. patent application Ser. No. 09/470,540, now U.S. Pat. No. 6,473,885 both filed on Dec. 22, 1999, and both assigned to the same assignee as the present application.

FIELD OF THE INVENTION

This invention relates to light emitting semiconductor structures and methods of making same and, more particularly, to devices and methods employing group III–V nitride semiconductors and to improving the manufacture and the operation thereof.

BACKGROUND OF THE INVENTION

Light emitting semiconductors which emit in several regions of the visible spectrum, for example group III–V semiconductors such as aluminum gallium arsenide and gallium phosphide, have achieved commercial acceptance for various applications. However, for applications which require blue or green light, for example green to be used for traffic signal lights or blue for a component of a red-green-blue primary color combination to be used for white lighting, efficient semiconductor light emitters have been sought for shorter visible wavelengths. If such solid state light emitting sources were available at reasonable cost, many lighting applications could benefit from the reliability and low energy consumption that characterize semiconductor operation. Short wavelength devices also hold promise of providing increased storage capacity on storage media, due to the ability to obtain smaller spot sizes for writing and reading on the media.

A type of short wavelength light emitting devices that has direct energy bandgap, and has shown excellent promise, is based on group III–V nitride semiconductors, which include substances such as GaN, AlN, InN, AlInN, GaInN, AlGaN, AlInGaN, BAlN, BInN, BGaN, and BAlGaInN, among others. [These are also sometimes referred to as III-nitride semiconductors.] An example of a light emitting device of this type is set forth in European Patent Publication EP 0926744, which discloses a light emitting device that has an active region between an n-type layer of III-nitride semiconductor and a p-type layer of III-nitride semiconductor. An electrical potential applied across the n and p layers of the diode structure causes generation of photons at the active region by recombination of holes and electrons. The wall-plug efficiency of the light emitting diode (LED) structure is defined by the optical power emitted by the device per unit of electric power. To maximize efficiency, both the light generated per watt of drive power and the amount of light exiting from the LED in a useful direction are considered.

As noted in the referenced EP Patent Publication, considerable effort has been expended in prior art approaches to maximize the light that is generated from the active region. The resistance of the p-type III-nitride semiconductor layer is much higher than the resistance of the n-type III-nitride semiconductor layer. The p-electrode typically spans essentially the entire active area to spread current uniformly to the junction with low electrical resistance. Although this increase in size of the p-electrode may increase the amount of light available from the active region, it can decrease the fraction of light that exits the device, since much of the light must pass through the p-electrode. The transmittance of the p-electrode can be increased by making the electrode thin or providing it with apertures (see, for example copending U.S. patent application Ser. No. 09/151,554, filed Sep. 11, 1998), but even these somewhat transmissive electrodes can absorb a significant amount of light, and their light transmission characteristics tend to trade-off against electrical operating efficiency, such as by compromising the uniform current density desired for the active region.

As noted in the above-referenced parent applications hereof, because III-nitride substrates are not commercially available, growth of III-nitride LEDs is typically implemented on non-lattice matched substrates such as sapphire or silicon carbide.

In so called "flip-chip" or "epitaxy side-down" configurations, the problem of light transmission through the electrodes is eliminated, as the device is flipped over and mounted with the epitaxy side down so that the light escapes predominantly through the substrate. The most common substrate is sapphire, but the relatively low refractive index of sapphire (n~1.8) limits performance due to index mismatch with the epitaxial region (which has n~2.4) that results in a "waveguiding" effect on some of the light generated at the active region. As described further hereinbelow, this portion of the light is trapped in the epitaxial region for one or more reflections as a significant fraction of the light energy is lost. Roughening of the sapphire/epilayer interface can help somewhat, but is of limited effectiveness and can have other disadvantages. Reference can be made to U.S. Pat. No. 6,091,085.

The above-referenced parent applications hereof describe some examples of prior art approaches that employ substrates of sapphire or of conductive silicon carbide, and these are summarized briefly as follows:

Nakamura et al. U.S. Pat. No. 5,563,422, Inoue et al. European Patent 091577A1, Kondoh et al. European Patent 0926744A2, and Mensz et al., Electronic Letters 33 (24) pp. 2066–2068, 1997, each disclose III-nitride LEDs formed on sapphire substrates. Nakamura et al. describes an epitaxy side-up configuration, and the others describe inverted (flip-chip) configurations. All of these approaches tend to be performance limited by, inter alia, the above-noted effect of a portion of the light being waveguided and trapped because of the sapphire/epitaxy index mismatch.

The published PCT Application WO96/09653 (Edmond et al.) discloses an embodiment with a vertical injection III-nitride LED on a conducting SiC substrate. A conductive buffer layer is required for Ohmic conduction from the III-nitride layers to the SiC substrate. The growth conditions required for a conductive buffer layer limits the growth conditions available for subsequent layers and thus restricts the quality of the III-nitride active region layers. Also, the conductive buffer layer may introduce optical loss mechanisms that limit light extraction efficiency. Furthermore, the SiC substrate must be doped to provide high electrical conductivity (p<0.2 Ω-cm) for low series resistance. Optical absorption resulting from SiC substrate dopants limits the light extraction efficiency of the device. These conditions result in a trade-off between series resistance and light extraction efficiency and serve to limit the electrical-to-optical power conversion efficiency of the LED.

Small-area surface-mount LED chips are attractive for many applications such as contour strip-lighting and back-lighting. For these devices, high light-generating capability is not required, but the devices should be efficient and inexpensive. Therefore, it is desirable for the devices to be as small as possible, with efficient use of the active region area. Also, these surface-mount devices should be capable of mounting to a package without the use of wirebonds. Conventional III-nitride devices most commonly employ sapphire substrates. These substrates are relatively inexpensive and suitable for the growth of good quality nitride films. Because the substrate is insulating, both p and n contacts are made on the same surface of the LED chip. This facilitates attaching the LED to a submount or package in the flip-chip approach that was first noted above, such that both p and n bondpads are electrically interconnected to the external package without wirebonds. However, in addition to the previously mentioned problem of light loss due to waveguiding, the sapphire substrate is difficult to dice in sizes less than 400×400 um^2, making it difficult to fabricate low-cost surface mount LED chip devices. Scribing-and-breaking, or sawing, the sapphire at these dimensions results in undesirably low yields and is unfavorable for high-volume manufacturing.

An alternative approach to fabricating III-nitride LEDs employs a conductive SiC substrate, as in the above-summarized Edmond et al. PCT published Application. The device growth includes a conductive buffer layer that enables vertical injection operation. The device has the advantage that it can be diced to very small dimensions (less than 300×300 um^2). A disadvantage is that the vertical-injection device is more difficult to package in a surface mount fashion since p and n contacts are on opposing surfaces, and wirebonds onto the LED chip are required. Furthermore, as previously noted, the doping required for SiC to be conducting results in excessive light absorption within the chip and limits extraction efficiency. Accordingly, conductive silicon carbide substrates do not offer a viable approach for manufacture of devices such as III-nitride small-area surface-mount LED chips.

It is among the objects of the present invention to provide improved semiconductor device manufacture and operation, particularly in addressing the types of problems associated with manufacture and operation of III-nitride small-area surface-mount LED chips.

SUMMARY OF THE INVENTION

In our above-referenced copending parent applications (Ser. Nos. 09/469,657 and 09/470,540), there is disclosed a III-nitride semiconductor light-emitting device with an increased light generating capability. In an embodiment thereof, a large area (greater than 400×400 um²) device, formed on a silicon carbide substrate, has an inverted configuration; that is, an epitaxy-side down structure with the light emitted predominately through the substrate. At least one n-electrode interposes the p-electrode metallization to provide low series resistance. The p-electrode metallization is opaque, highly reflective, and Ohmic, and provides excellent current spreading. Light absorption in the p-electrode at the peak emission wavelength of the LED active region is less than 25% per pass. An intermediate material or submount can be used to provide electrical and thermal connection between the LED die and the package. The submount material may be Si to provide electronic functionality such as voltage-compliance limiting operation, protection from electrostatic discharge (ESD), series-string LED arrays, and feedback-controlled light output. The entire device, including the LED-submount interface, is designed for low thermal resistance to allow for high current density operation.

An approach hereof to fabricating efficient, low-cost small-area surface-mount LED chips employs a substantially transparent, high-refractive index substrate, that can be diced into small chips. One embodiment hereof employs a low light absorption SiC substrate as an extraction window rather than as a conductive substrate. In this embodiment, both p and n contacts are formed on one surface of the LED, facilitating surface-mount attach. Also, the high refractive index of the SiC substrate (n~2.7) eliminates the waveguide problem imposed by the use of sapphire, resulting in higher extraction efficiency. SiC can be easily diced into very small chips, so efficient low-cost manufacture of small devices is facilitated by the present invention.

Preferably, the index of refraction, n, of the substrate is n>2.0 and, more preferably, n>2.3. The light absorption of the substrate, at the relevant wavelength or small range of wavelengths, is defined by the light absorption coefficient, $\alpha$, in the equation $I=I_o e^{-\alpha d}$, where $I_o$ is the input light intensity, d is the optical pathlength through the absorbing medium, and I is the output light intensity. As used herein, the light absorption coefficient of a substantially transparent substrate is preferably $\alpha<3$ cm$^{-1}$ and, more preferably, $\alpha<1$ cm$^{-1}$.

In accordance with a form of the invention, there is provided a light-emitting device, comprising: a semiconductor structure formed on one side of a substrate, the semiconductor structure having a plurality of semiconductor layers and an active region within the layers; and first and second conductive electrodes contacting respectively different semiconductor layers of the structure; the substrate comprising a material having a refractive index n>2.0 and light absorption coefficient $\alpha$, at the emission wavelength of the active region, of $\alpha<3$ cm$^{-1}$. In a preferred embodiment of this form of the invention, the substrate material has a refractive index n>2.3, and the light absorption coefficient, $\alpha$, of the substrate material is $\alpha<1$ cm$^{-1}$.

In accordance with a form of the technique of the invention, there is disclosed a method for making semiconductor light emitting device chips, comprising the following steps: providing a substrate of substantially transparent silicon carbide; forming a semiconductor structure on one side of the substrate, the semiconductor structure having a plurality of semiconductor layers and an active region within the layers; applying electrodes to semiconductor layers of the structure to form semiconductor light emitting devices; and dicing the substrate and devices into a plurality of chips. In an embodiment of this form of the invention, the step of forming a semiconductor structure having a plurality of layers comprises providing a plurality of layers including an n-type layer of a III-nitride semiconductor and a p-type layer of a III-nitride semiconductor on opposing sides of the active region. In this embodiment the substrate and devices are sawed into dice of dimensions less than 400×400 um (and /or area less than 0.16 mm²). In a further embodiment, the substrate and devices are sawed into dice of dimensions less than 300×300 um (and/or an area less than 0.09 mm²). Alternatively, in these embodiments, at least one dimension is less than 400 um or 300 um, as the case may be. The silicon carbide substrates are particularly advantageous for this purpose, as compared, for example, to the more common sapphire substrates which cannot be easily diced into such small pieces using presently available techniques without unacceptable breakage that substantially lowers yields.

Further features and advantages of the invention will become more readily apparent from the following detailed description when taken in conjunction with the accompanying drawings.

DETAILED DESCRIPTION

Figure 1:
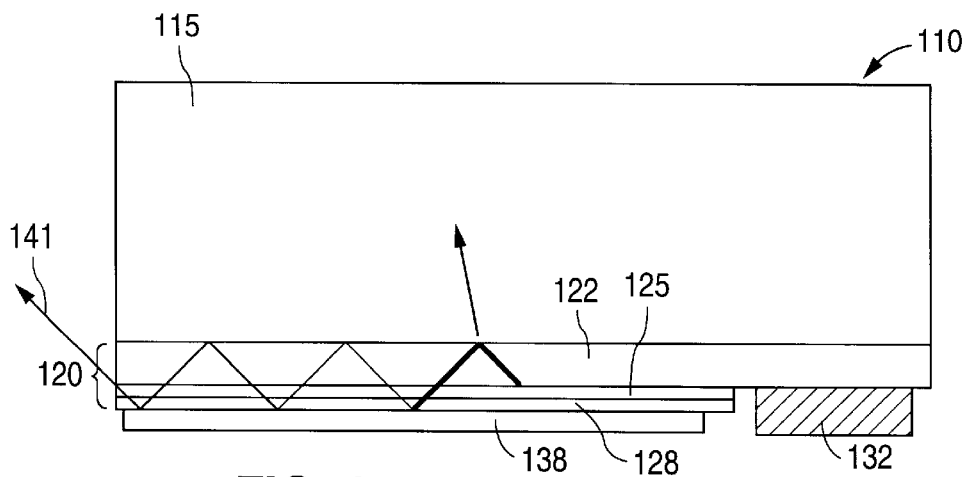
FIG. 1 is a diagram that illustrates a prior art III-nitride light emitting device with a sapphire substrate, which demonstrates the deleterious waveguiding effect that reduces useful light output.

FIG. 1 illustrates an example of a prior art type of III-nitride semiconductor device 110 in a so-called flip-chip or inverted or epitaxy-down configuration. In this example, the substrate 115, on which the device was originally formed, is sapphire, which has an index of refraction n~1.8. [The substrate 115, after inversion, is sometimes referred to as a superstrate.] The epitaxy region 120 of III-nitride semiconductor layers includes n-type layer 122 and p-type layer 128, with an active region p-n junction between the n-type and p-type layers. Typically, an active region layer 125 of III-nitride semiconductor is disposed at the p-n junction. A conductive p-electrode 138 is deposited on the p-type layer 128 and a conductive n-electrode 132 is deposited on the n-type layer 122. In this prior art configuration, the electrodes are typically opaque and reflective, and the objective is to emit as much of the light as possible through the top and sides of the sapphire superstrate 115. The sapphire is relatively transmissive of the optical radiation. However, sapphire has an index of refraction, n~1.8, which is substantially lower than the index of refraction of the epilayer region (n~2.4). This results in a critical angle of about $\sin \theta_c = 1.8/2.4$; that is, $\theta_c = 48.6$ degrees. Accordingly, any portion of the light that is incident on the sapphire/epilayers boundary at an angle which is greater than the critical angle (with respect to the normal to the boundary), will experience total internal reflection, and this corresponds to roughly 70% of the total generated light from the active region. This results in the "waveguiding" type of effect illustrated for the ray 141 in FIG. 1, and substantial loss of output light, since each reflection involves some loss of light energy, particularly reflections from lossy media such as the metal electrodes and lossy transmission through the epilayers. Accordingly, it is seen that light extraction from conventional flip-chip III-nitride LEDs, which employ sapphire superstrates, is problematic due, at least in part, to waveguiding in the III-nitride epilayers that results in losses of precious light energy.

Figure 2:
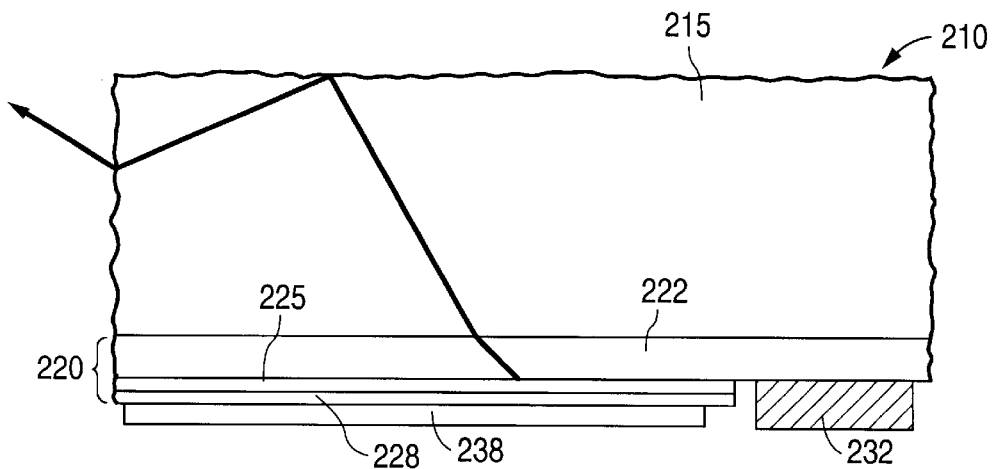
FIG. 2 is a diagram of a III-nitride light emitting device in accordance with an embodiment of the invention, which employs a transparent silicon carbide substrate, and demonstrates the improved light extraction that results from the absence of the waveguiding effect.

The improvement in light extraction resulting from an embodiment of the invention is illustrated in conjunction with FIG. 2, which again shows a flip-chip III-nitride semiconductor LED, designated 210, but in this case with a substantially transparent high index substrate 215. In a preferred embodiment hereof, the substrate material comprises substantially transparent silicon carbide. The epitaxy region 220 of III-nitride semiconductor layers includes n-type layer 222 and p-type layer 228, with a p-n junction between the n-type and p-type layers. An active region 225 of III-nitride semiconductor is disposed at the p-n junction. In one example, the p- and n-type layers include p-type GaN (such as GaN:Mg) and n-type GaN (such as GaN:Si), while the active region is comprised of InGaN, and may include one or more InGaN quantum well layers. However, any suitable material system may be used. A conductive p-electrode 238 is deposited on the p-type layer 228 and a conductive n-electrode 232 is deposited on the n-type layer 222. Again, the electrodes are opaque and reflective. In this case, the transparent SiC has an index of refraction n~2.7, which is greater than the epilayer index (n~2.4). This removes the critical angle consideration, and eliminates the type of waveguiding within the epilayer region that was seen in the FIG. 1 example. The low light absorption of the superstrate at the emission wavelength also contributes substantially to the output efficiency. The light absorption coefficient, α, at the emission peak wavelength, is preferably α<3 and, more preferably, α<1. In this instance, the majority of the light incident on the interface between the epilayer region and the superstrate (generally either emanating directly from the active region or after a single reflection from a reflective electrode) will pass into the superstrate 215, with the high probability to become useful output light. As seen in FIG. 2, it can be advantageous in this embodiment to provide rough surfaces (such as sawn edges or ground top surfaces) on the superstrate to help light escape from the superstrate and into the lower index environment outside the superstrate; that is, either the air or an encapsulant having an intermediate index of refraction.

Figure 3:
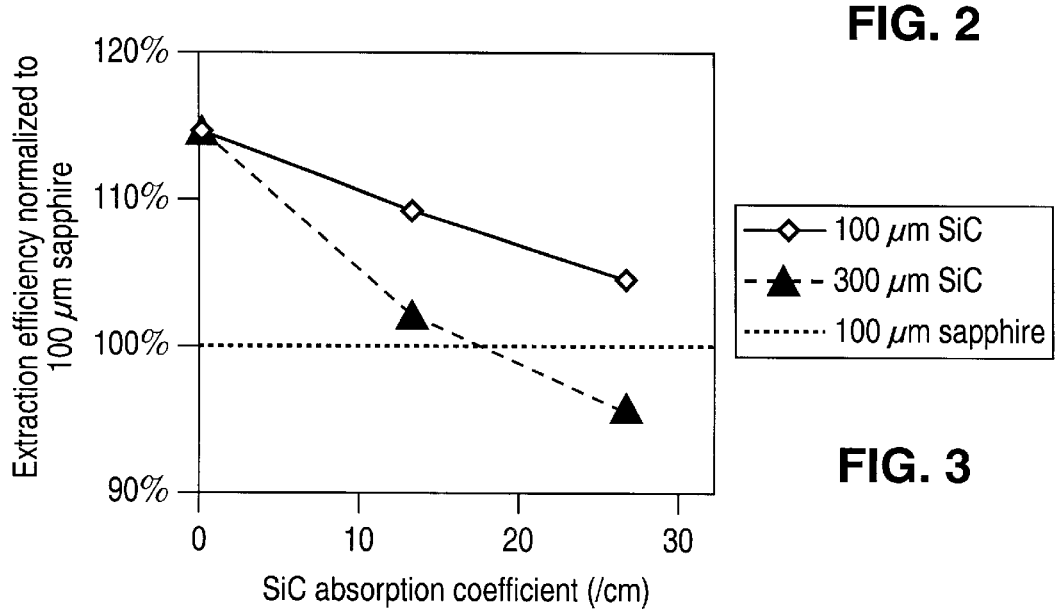
FIG. 3 is a graph that illustrates the advantage of high transparency silicon carbide as compared to sapphire in producing a high efficiency III-nitride light emitting device.

FIG. 3 is a graph that illustrates the advantage of high transparency silicon carbide as compared to sapphire in producing a high efficiency III-nitride light emitting device. Extraction efficiency, normalized to the case of GaN/sapphire (FIG. 1), is plotted as a function of SiC absorption coefficient, for different thicknesses of SiC. These calculations were made for the example of an epoxy-encapsulated chip. The dependence of extraction efficiency on absorption coefficient will increase in the case of a non-encapsulated chip.

Figure 4:
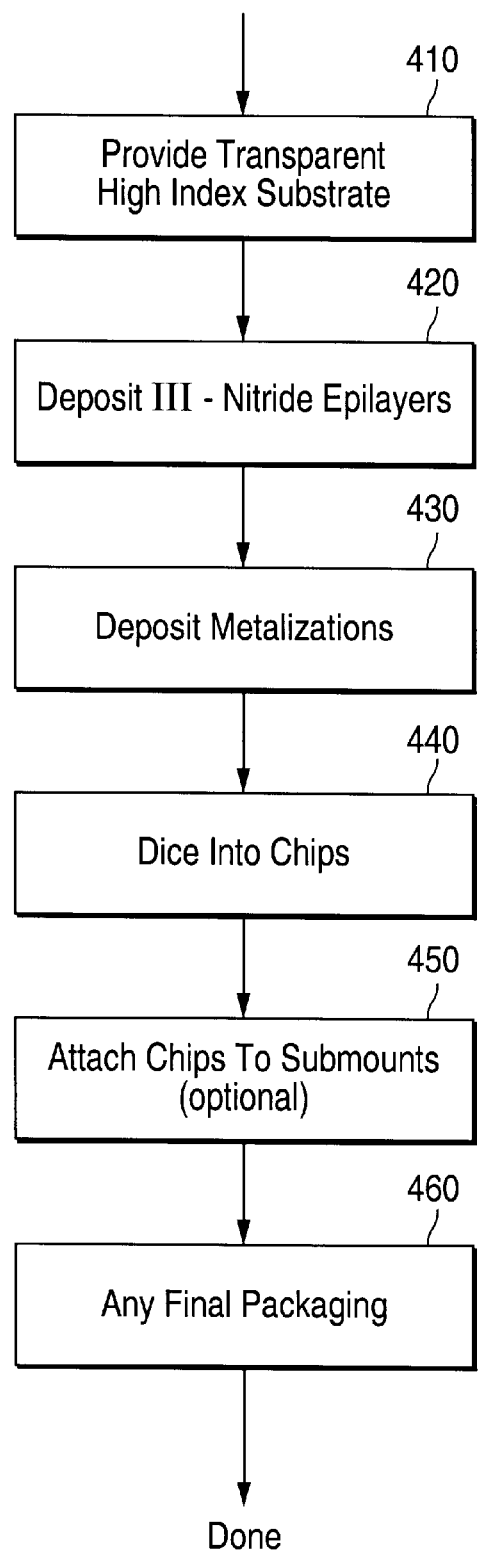
FIG. 4 is a flow diagram illustrating steps of an LED chip fabrication technique in accordance with an embodiment of the invention.

FIG. 4 is a flow diagram which describes a technique for practicing an embodiment of the invention for fabricating small-area LED chips. The block 410 represents the providing of a suitable substantially transparent high refractive index substrate. As above indicated, the substrate is selected to have a light absorption coefficient, α, at the emission peak wavelength, preferably α<3 cm$^{-1}$, and, more preferably α<1 cm$^{-1}$, and to have an index of refraction, n, preferably n>2.0 and, more preferably n>2.3. In one preferred embodiment hereof, the substrate is transparent silicon carbide having an index of refraction n~2.7, and an absorption coefficient, α, less than about 1 cm$^{-1}$ in the ~470 nm wavelength regime. In an example hereof, the SiC substrate has a thickness in the range 50 to 500 um. The block 420 represents the deposition of the III-nitride epilayers, in known fashion, on the substrate. Next, as represented by the block 430, the metalizations, including the electrodes and bondpads, are deposited. The substrate wafer can then be diced into chips, either by scribing-and-breaking or using a sawing technique (block 440). In one embodiment hereof, the chips are sawed into dice of dimensions less than 400×400 um (and/or area less than 0.16 mm$^2$). In a further embodiment hereof, the chips are sawed into dice of dimensions less than 300×300 um (and/or an area less than 0.09 mm$^2$). Alternatively, in these embodiments, at least one dimension is less than 400 um or 300 um, as the case may be. The silicon carbide substrates are particularly advantageous for this purpose, as compared, for example, to sapphire substrates which cannot be easily diced into such small pieces using presently available techniques without unacceptable breakage that substantially lowers yields. The preferred surface roughening on the exposed surfaces of the substrate, not already suitably roughened by sawing, can be achieved, for example, by grinding or etching. Next, as represented by the block 450, the chips are attached to submounts (this step being optional), and final packaging can then be implemented (block 460).

In accordance with a further embodiment of the invention, the substrate can comprise transparent polycrystalline silicon carbide, which can be formed by chemical vapor deposition (CVD) and machined into wafers of large sizes and arbitrary shapes. Because the polycrystalline grains are oriented, these substrates could be suitable for MOCVD growth using, for example, the III-nitride material system. Furthermore, a low-impurity version of such a substrate could provide the required attributes (n>2.0, $\alpha<3$ cm$^{-1}$) for a high-efficiency LED as described herein. In another form of this embodiment, the polycrystalline SiC wafers can be laminated with a single crystal 3C SiC film via a silicon-on-insulator (SOI) wafer-bonding and carbonization process. [Reference can be made to K. D. Hobart et al., J. Electrochem. Soc.146, 3833–3836, 1999.] The laminated substrates can be used to grow the III-nitride epitaxial layers, as in the previously described embodiment, and devices can be formed thereon before dicing into small chips and bonding to submounts before final packaging to form the small area surface-mount LED chips. These devices have the previously enumerated advantages, including the ability during manufacture to to be sawn into small chips, and the operational advantage of substantially eliminating the trapped light losses that resulted in the prior from the refractive index mismatch between the III-nitride epilayers and a sapphire superstrate. Furthermore, the relatively low cost large-area poly-SiC/SiC substrates can provide high volume production advantages. Low absorption GaN, AlN, or other III-nitride substrates can also be utilized.

What is claimed is:

1. A light-emitting device, comprising:
   a semiconductor structure formed on one side of a substrate, said semiconductor structure having a plurality of semiconductor layers and an active region within said layers; and
   first and second conductive electrodes contacting respectively different semiconductor layers of said structure on said one side of said substrate;
   said substrate comprising a material having a refractive index n>2.0 and light absorption coefficient $\alpha$, at the emission wavelength of said active region, of $\alpha<3$ cm$^{-1}$.

2. The device as defined by claim 1, wherein said substrate material has a refractive index n>2.3.

3. The device as defined by claim 1, wherein said light absorption coefficient $\alpha$, of said substrate material is $\alpha<1$ cm$^{-1}$.

4. The device as defined by claim 2, wherein said light absorption coefficient $\alpha$, of said substrate material is $\alpha<1$ cm$^{-1}$.

5. The device as defined by claim 1, wherein said substrate material comprises silicon carbide.

6. The device as defined by claim 4, wherein said substrate material comprises silicon carbide.

7. The device as described by claim 1, wherein said substrate material comprises polycrystalline silicon carbide.

8. The device as described by claim 4, wherein said substrate material comprises polycrystalline silicon carbide.

9. The device as defined by claim 1, wherein said substrate material comprises polycrystalline silicon carbide having single crystal silicon carbide thereon.

10. The device as defined by claim 4, wherein said substrate comprises polycrystalline silicon carbide having single crystal silicon carbide thereon.

11. The device as defined by claim 5, wherein said device has at least one dimension perpendicular to its thickness that is less than 400 um.

12. The device as defined by claim 5, wherein said device has dimensions perpendicular to its thickness that are less than 400×400 um.

13. A light emitting device, comprising:
    a semiconductor structure formed on one side of a substrate, said structure having a plurality of semiconductor layers and an active region within said layers, said plurality of layers including an n-type layer of a III-nitride semiconductor and a p-type layer of III-nitride semiconductor on opposing sides of said active region;
    first and second conductive electrodes respectively contacting said n-type layer and said p-type layer; and
    means for applying electric signals across said electrodes to produce light at said active region, the majority of said light being emitted from said device via said substrate;
    said substrate comprising a material having a refractive index n>2.0 and light absorption coefficient $\alpha$, at the emission wavelength of said active region, of $\alpha<3$ cm$^{-1}$.

14. The device as defined by claim 13, wherein said substrate material has a refractive index n>2.3.

15. The device as defined by claim 13, wherein said light absorption coefficient $\alpha$, of said substrate material is $\alpha<1$ cm$^{-1}$.

16. The device as defined by claim 14, wherein said light absorption coefficient $\alpha$, of said substrate material is $\alpha<1$ cm$^{-1}$.

17. The device as defined by claim 14, wherein said substrate material comprises silicon carbide.

18. The device as defined by claim 15, wherein said substrate material comprises silicon carbide.

19. The device as defined by claim 16, wherein said substrate material comprises silicon carbide.

20. The device as described by claim 14, wherein said substrate material comprises polycrystalline silicon carbide.

21. The device as defined by claim 14, wherein said substrate material comprises polycrystalline silicon carbide having single crystal silicon carbide thereon.

22. The device as defined by claim 13, wherein said substrate material comprises GaN.

23. The device as defined by claim 13, wherein said substrate material comprises AlN.

24. The device as defined by claim 13, wherein said substrate material comprises III-nitride material.

25. The device as defined by claim 13, wherein said device has at least one dimension perpendicular to its thickness that is less than 400 um.

26. The device as defined by claim 16, wherein said device has at least one dimension perpendicular to its thickness that is less than 400 um.

27. The device as defined by claim 14, wherein said device has dimensions perpendicular to its thickness that are less than 400×400 um.

28. The device as defined by claim 14, wherein said device has an area less than 0.16 mm$^2$.

29. A light emitting device, comprising:

a semiconductor structure formed on one side of a substrate, said structure having a plurality of semiconductor layers and an active region within said layers, said plurality of layers including an n-type layer of a III-nitride semiconductor and a p-type layer of III-nitride semiconductor on opposing sides of said active region;

first and second conductive electrodes respectively contacting said n-type layer and said p-type layer; and means for applying electric signals across said electrodes to produce light at said active region, the majority of said light being emitted from said device via said substrate;

said substrate comprising polycrystalline silicon carbide.

30. The device as defined by claim 29, wherein said substrate comprises polycrystalline silicon carbide having single crystal silicon carbide thereon.

* * * * *